United States Patent
Forstner

(10) Patent No.: US 9,166,706 B2
(45) Date of Patent: Oct. 20, 2015

(54) SYSTEM AND METHOD FOR TESTING A RADIO FREQUENCY INTEGRATED CIRCUIT

(71) Applicant: Infineon Technologies AG, Neubiberg (DE)

(72) Inventor: Hans Peter Forstner, Steinhoering (DE)

(73) Assignee: Infineon Technologies AG, Neubiberg (DE)

( * ) Notice: Subject to any disclaimer, the term of this patent is extended or adjusted under 35 U.S.C. 154(b) by 38 days.

(21) Appl. No.: 14/198,059

(22) Filed: Mar. 5, 2014

(65) Prior Publication Data

US 2014/0187170 A1    Jul. 3, 2014

Related U.S. Application Data

(62) Division of application No. 12/952,261, filed on Nov. 23, 2010, now Pat. No. 8,686,736.

(51) Int. Cl.
| | |
|---|---|
| *H04W 24/00* | (2009.01) |
| *H04B 17/00* | (2015.01) |
| *G01R 31/28* | (2006.01) |
| *G01R 31/3187* | (2006.01) |

(52) U.S. Cl.
CPC ........... *H04B 17/00* (2013.01); *G01R 31/2822* (2013.01); *G01R 31/3187* (2013.01)

(58) Field of Classification Search
USPC ................ 455/423, 425, 67.11, 67.13, 67.14; 324/537, 762.01, 762.02, 750.3, 324/750.01
See application file for complete search history.

(56) References Cited

U.S. PATENT DOCUMENTS

| | | | |
|---|---|---|---|
| 5,493,209 A | 2/1996 | Gumm et al. | |
| 5,835,850 A * | 11/1998 | Kumar | 455/67.14 |
| 6,335,645 B1 * | 1/2002 | Matsuo et al. | 327/141 |
| 6,728,902 B2 * | 4/2004 | Kaiser et al. | 714/30 |
| 6,832,075 B1 * | 12/2004 | Henry, Jr. | 455/67.14 |
| 6,882,827 B1 * | 4/2005 | Collier | 455/67.11 |
| 7,020,443 B2 * | 3/2006 | Talvitie et al. | 455/67.14 |
| 7,181,205 B1 * | 2/2007 | Scott et al. | 455/423 |
| 7,319,625 B2 * | 1/2008 | Chang et al. | 365/201 |
| 7,363,563 B1 * | 4/2008 | Hissen et al. | 714/733 |
| 7,477,875 B2 * | 1/2009 | Zhang et al. | 455/67.11 |
| 7,492,180 B2 | 2/2009 | Forstner | |
| 7,554,335 B2 * | 6/2009 | Han et al. | 324/537 |
| 7,565,589 B2 * | 7/2009 | Shiota | 714/724 |
| 7,688,058 B2 | 3/2010 | Jenkins et al. | |
| 7,904,768 B2 * | 3/2011 | Wu et al. | 714/724 |
| 7,925,220 B2 * | 4/2011 | Baker | 455/67.14 |
| 7,958,408 B2 * | 6/2011 | de Obaldia et al. | 714/715 |

(Continued)

FOREIGN PATENT DOCUMENTS

| | | |
|---|---|---|
| CN | 101414806 A | 4/2009 |
| CN | 101784904 A | 7/2010 |

(Continued)

*Primary Examiner* — Tuan A Tran
(74) *Attorney, Agent, or Firm* — Slater & Matsil, L.L.P.

(57) ABSTRACT

In an embodiment, a method of testing a radio frequency integrated circuit (RFIC) includes generating high frequency test signals using the on-chip test circuit, measuring signal levels using on-chip power detectors, and controlling and monitoring the on-chip test circuit using low frequency signals. The RFIC circuit is configured to operate at high frequencies, and an on-chip test circuit that includes frequency generation circuitry configured to operate during test modes.

19 Claims, 4 Drawing Sheets

(56) References Cited

U.S. PATENT DOCUMENTS

| | | |
|---|---|---|
| 8,018,287 B2 | 9/2011 | Shimamoto et al. |
| 8,284,886 B2 * | 10/2012 | Staszewski et al. ............ 375/376 |
| 8,311,506 B2 * | 11/2012 | Rofougaran ................. 455/296 |
| 8,453,043 B2 * | 5/2013 | Chien et al. .................. 714/819 |
| 8,472,883 B2 * | 6/2013 | Olesen et al. .............. 455/67.14 |
| 8,589,750 B2 * | 11/2013 | Banerjee et al. .............. 714/733 |
| 8,634,766 B2 * | 1/2014 | Hobbs et al. ...................... 455/8 |
| 8,649,736 B2 * | 2/2014 | Descombes et al. ....... 455/67.14 |
| 8,711,981 B2 * | 4/2014 | Dehlink et al. ............... 375/316 |
| 8,781,403 B2 * | 7/2014 | Olesen et al. .............. 455/67.14 |
| 9,031,514 B2 * | 5/2015 | Olesen et al. .............. 455/67.14 |
| 2006/0217085 A1 * | 9/2006 | Eisenstadt et al. ............ 455/126 |
| 2006/0234634 A1 | 10/2006 | Agnus et al. |
| 2006/0252375 A1 * | 11/2006 | Wu et al. ................... 455/67.11 |
| 2007/0026809 A1 * | 2/2007 | Zhang et al. ............... 455/67.11 |
| 2008/0086668 A1 | 4/2008 | Jefferson et al. |
| 2008/0170506 A1 | 7/2008 | Hurley |
| 2010/0120369 A1 * | 5/2010 | Ko et al. .................... 455/67.11 |
| 2010/0227574 A1 | 9/2010 | Kuenen et al. |

FOREIGN PATENT DOCUMENTS

| | | |
|---|---|---|
| DE | 102006024460 A1 | 11/2007 |
| JP | 63094710 A | 4/1988 |
| JP | 9064278 A | 7/1997 |
| JP | 11083934 | 3/1999 |
| JP | 2004226191 A | 8/2004 |
| JP | 2006510274 A | 3/2006 |
| WO | 2008089574 A1 | 7/2008 |

* cited by examiner

SYSTEM AND METHOD FOR TESTING A RADIO FREQUENCY INTEGRATED CIRCUIT

This application claims the benefit of U.S. Non-Provisional application Ser. No. 12/952,261, filed on Nov. 23, 2010, entitled System and Method for Testing a Radio Frequency Integrated Circuit, which application is hereby incorporated herein by reference in its entirety.

TECHNICAL FIELD

This invention relates generally to semiconductor devices and methods, and more particularly to a system and method of testing a radio frequency (RF) integrated circuit.

BACKGROUND

With the increased demand for millimeter-wave based RF systems, there has been a corresponding interest in integrating these RF systems on silicon-based integrated circuits instead of using discrete III/V based semiconductor components. Millimeter-wave frequencies are generally defined to be between about 30 GHz and 300 GHz. Common applications for millimeter-wave base RF systems include, for example, automotive radar and high frequency communications systems. By using silicon integration, larger volumes of these RF systems can be manufactured at a lower cost than discrete component based systems.

Testing millimeter wave based systems, however, is difficult and expensive. For example, in systems that operate at over 10 GHz, the precision test fixtures and equipment used to test these systems are expensive. These test fixtures and equipment are time consuming to operate, calibrate and maintain, and the RF probes used for testing have a limited lifetime and wear out over time. Physical deformations, such as bent contacts, can affect high frequency matching networks, and corrosion of contacts and connectors can degrade attenuation characteristics of the test setup. Furthermore, the expertise required to maintain and operate such high-frequency test equipment is not often available in the high-volume semiconductor test environments. As such, even if large volumes of millimeter-wave RF integrated circuits can be manufactured, testing the integrated circuits can become a large bottleneck.

FIG. 1 illustrates, for example, conventional RF integrated circuit test setup 100. RFIC 102 having RF circuit 104 is packaged in package 106. RF test fixture 108 is coupled to package 106. In such a system, RF testing of RFIC 102 is performed by RF test fixture 108 at high frequencies. One way to save test time and cost is by not performing a full test of the RF signal path. In some systems, such as radar-based automotive collision warning systems, full and comprehensive testing may be needed to ensure safety and reliability of the system.

SUMMARY OF THE INVENTION

In an embodiment, a method of testing a radio frequency integrated circuit (RFIC) includes generating high frequency test signals using the on-chip test circuit, measuring signal levels using on-chip power detectors, and controlling and monitoring the on-chip test circuit using low frequency signals. The RFIC circuit is configured to operate at high frequencies, and an on-chip test circuit that includes frequency generation circuitry configured to operate during test modes.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system and method for testing an RF integrated circuit. The invention may also be applied, however, to other types of circuits.

Figure 1:
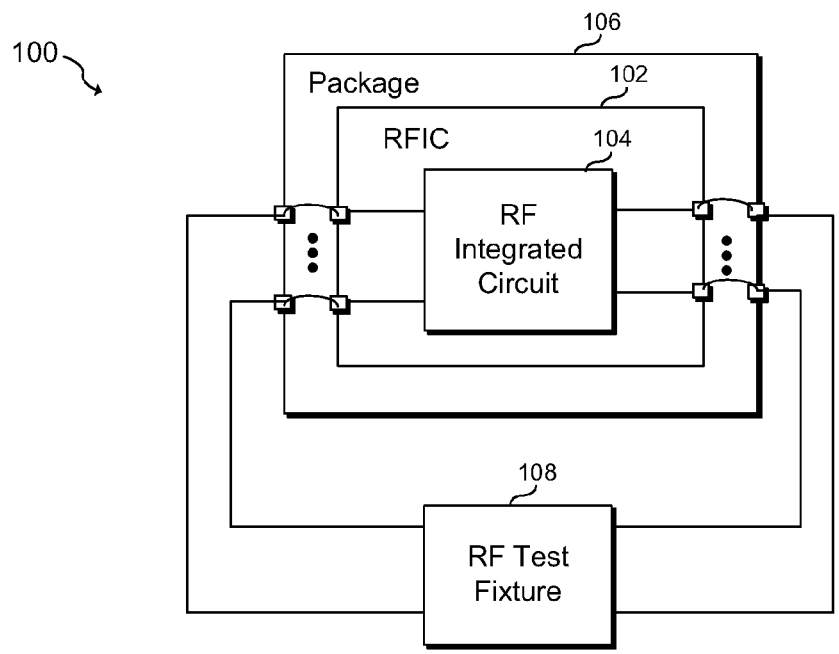
FIG. 1 illustrates a conventional RF integrated circuit test setup.
Figure 2:
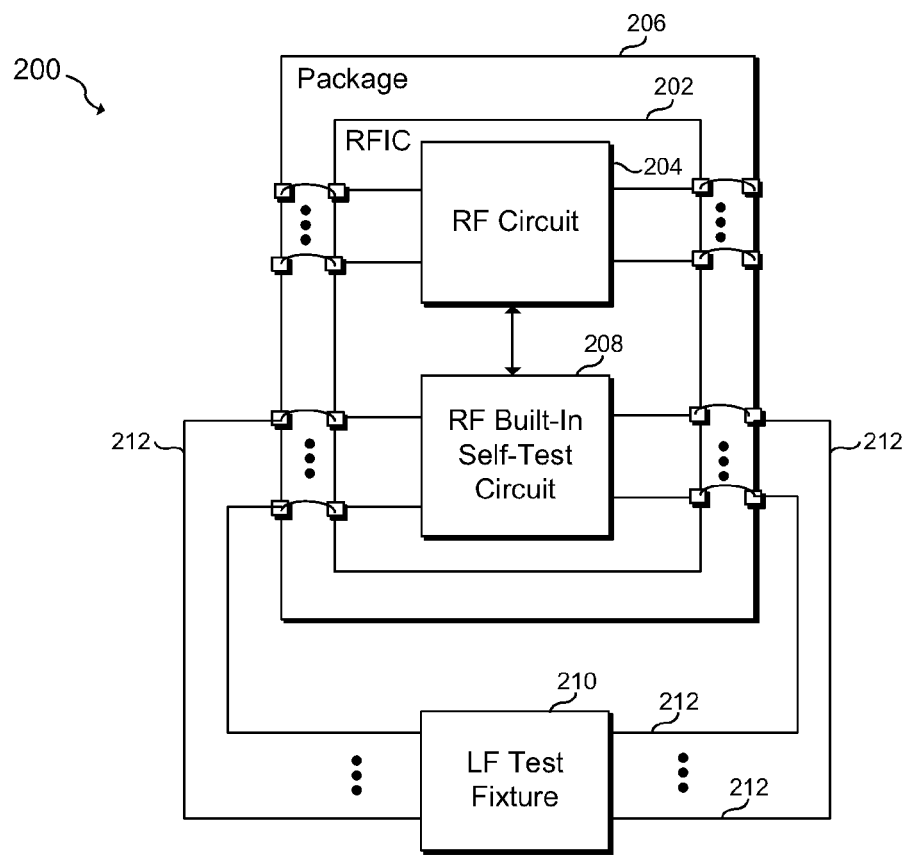
FIG. 2 illustrates an RF integrated circuit test setup according to an embodiment of the present invention.

FIG. 2 illustrates RF integrated circuit test setup 200 according to an embodiment of the present invention. RFIC 202 has RF circuit 204 and built-in self-test circuit 208. In an embodiment, built in self-test circuit 208 is configured to interface with low frequency (LF) test fixture 210 via test connections 212. In embodiments, RF circuit can be of a variety of RF circuits including, but not limited to such circuits as RF receivers, transmitters, radars, RF communication systems, oscillators, filters, and the like. In some embodiments, RF circuit 204 operates at frequencies of greater than 10 GHz, for example, at about 24 GHz or at about 77 GHz for some automotive radar applications. In alternative embodiments, RF circuit 204, or portions of RF circuit 204 operate at frequencies lower than 10 GHz.

In some embodiments, RFIC IC is packaged in package 206 during testing. Alternatively, RFIC 204 can be tested outside of package 206, for example, during wafer test, as a bare die, or at a board level if RFIC 204 is mounted as a chip on board. Package 206 can be any of a variety of packages including, but not limited to, a plastic dual in-line package (PDIP), ceramic dual in-line package (CERDIP), single in-line package (SIP), small outline (SO) package, SO package with j-bend leads (SOJ), SO package with c-shaped leads (COJ), shrink SO body size (SSOP), miniature body size (MSOP), plastic quad flat pack (PQFP), plastic leadless chip carrier (PLCC), ceramic quad flat pack (CERQUAD), bump chip carrier (BCC), or a ball grid array (BGA).

In an embodiment, LF Test Fixture 210 includes test equipment configured to operate at lower frequencies than the nominal operating frequencies of RF Circuit 204. In one embodiment, the signal frequencies at test connections 212 are at DC and/or less than 1 MHz. In other embodiments, higher frequencies can be used.

Figure 3:
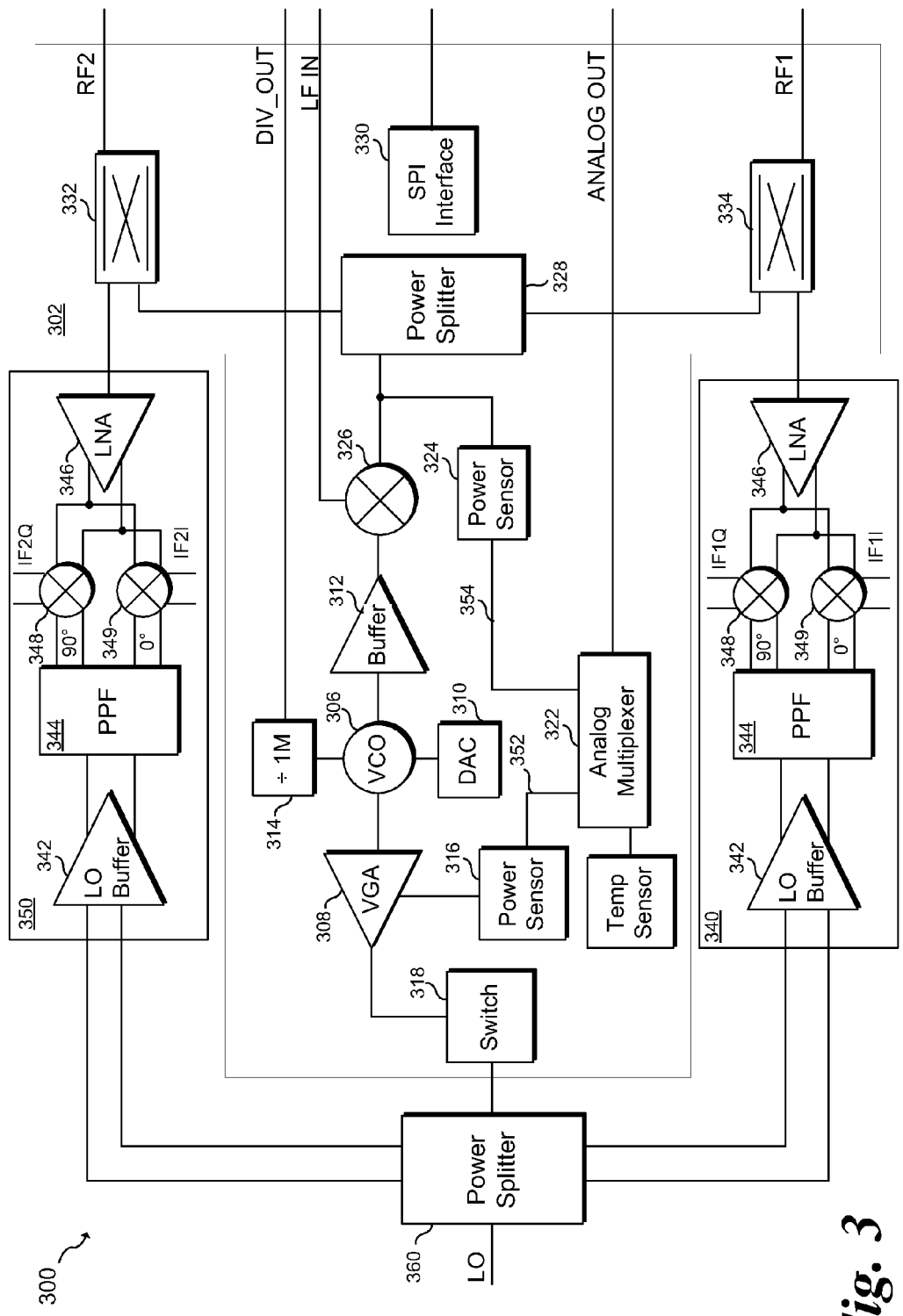
FIG. 3 illustrates an RF integrated circuit according to an embodiment of the present invention.

FIG. 3 illustrates embodiment RFIC 300 having built-in test equipment (BITE) section 302 and an RF circuit section. In one embodiment, the RF circuit section is a receiver for a frequency modulated continuous wave (FMCW) radar system using a dual complex homodyne downconverter. The RF circuit section has two downconverter blocks 340 and 350 that receive a local oscillator (LO) signal via power splitter 360. Each downconverter block 340 and 350 has LO buffer 342, polyphase filter 344, mixers 348 and 349 and low noise amplifier (LNA) 346. In an embodiment, in phase and quadrature outputs IF1I and IF1Q of downconversion block 340 and in phase and quadrature outputs IF2I and IF2Q of downconversion block 350 are sent to intermediate frequency and/or baseband processing circuitry (not shown). The output of these intermediate frequency and/or baseband processing circuits are then sent to the low frequency tester. LNAs 346 of downconversion blocks 340 and 350 are coupled to RF input signals RF1 and RF2, respectively, via couplers 334 and 332. Alternatively, switches can be used instead of or addition to couplers 334 and 332. It should be understood that that downconverter blocks 340 and 350 are examples of functional RF circuits that can be tested by an embodiment BITE block. In further embodiments, other functional RF circuits can be implemented and tested by embodiment BITE blocks.

In an embodiment, BITE section 302 provides high frequency test functionality to the RF circuit section. Voltage controlled Oscillator (VCO) 306 generates the RF signal within the frequency band of operation of the RF circuit section. For example, in one embodiment, VCO 306 operates at about 24 GHz. In alternative embodiments, other frequencies can be used. In an embodiment, VCO 306 is implemented using a varactor diode tuned Colpitts oscillator, and digital to analog converter (DAC) 310 used to perform stepwise frequency adjustment of VCO 306. In embodiments that use a digitally controlled oscillator, no externally provided analog tuning voltages are necessary. Such embodiments minimize application effort and avoids noise coupling to the sensitive tuning inputs of the oscillator. In other embodiments, a digitally programmable oscillator using, for example, switchable tank oscillator segments, can be used. In some embodiments, the VCO frequency is set, either directly or via DAC 310, using serial peripheral interface (SPI) 330.

The output signal of VCO 306 is sent to variable gain amplifier (VGA) 308, buffer 312, and frequency divider block 314. In an embodiment, frequency divider block 314 has a high division ratio to provide a low frequency output signal that can be easily measured by a frequency counter and/or a microprocessor. In the illustrated embodiment of FIG. 3, frequency divider 314 has a division ratio of $2^{20}$ to produce an output clock of about 23 KHz. In alternative embodiments, other division ratios and output frequencies can be used. In one embodiment, the low frequency test equipment uses the low frequency output of divider 314 to monitor and set the frequency of VCO 306. For example, in one embodiment, external low frequency test equipment measures the divided output of frequency divider 314 and increments and/or decrements DAC 310 until a target frequency is reached.

In an embodiment, VGA 308 generates the LO drive for the downconversion mixers of receivers 340 and 350 via switch 318 and power splitter 360. During testing, switch 318 is closed. In one embodiment, the LO input port to power splitter 360 signal is terminated by an adequate impedance during testing while VGA 308 provides the LO signal. One the other hand, when BITE 302 is inactive, switch 318 disconnects the BITE 302 from power splitter 360. The amplitude of the output of VGA 308 is detected by power sensor 316, which provides a DC output signal 352 as an indication of the signal strength. In one embodiment, DC output signal 352 is routed to output pin ANALOG OUT via multiplexer 322. In an alternative embodiments, DC output signal 352 is digitized using an on-board A/D converter (not shown) and can be output using the SPI interface 330.

In some embodiments, switch 318 is implemented using bipolar transistors. Alternatively, switch 318 can be implemented using PIN diodes, MOS transistors or other devices.

In an embodiment, mixer 326 with preceding buffer amplifier 312 is also coupled to the output of VCO 306. The buffer amplifier 312 isolates the oscillator core from the mixer. In some embodiments, however, buffer amplifier can be omitted. Mixer 326 is operated in a single sideband (SSB) mode in some embodiments or in a double sideband (DSB) mode in other embodiments depending on the system and its specifications. In some embodiments, mixer 326 is operated in a DSB mode with a suppressed carrier.

In an embodiment, mixer 326 upconverts an externally provided low frequency (LF) signal to the RF domain. In some embodiments, this LF signal can between about DC and about 1 MHz. Alternatively, other frequency ranges can be used. Power sensor 324 measures the output power of mixer 326 and produces DC signal 354, which provides an indication of the signal strength at the output of mixer 326. In one embodiment, DC signal 354 is routed to ANALOG OUT via analog multiplexer 322. Alternatively, DC signal 354 can be digitized via an on board A/D converter (not shown), the output of which can be made digitally available via SPI 330 or other interface.

In an embodiment, the output of mixer 326 is split using power splitter 328 and routed to the inputs of downconversion blocks 340 and 350 via couplers 334 and 332 respectively. In an embodiment, couplers 332 and 334 attenuate the outputs of power splitter 328 between −10 dB and −20 dB. Alternatively, other coupling losses can be used. For example, the coupling loss of couplers 332 and 334 can be adjusted to provide a desired input RF signal to downconversion circuits 340 and 350. In some embodiments, weakly coupled directional couplers are used to provide a very low-level RF input. In an embodiment, couplers 332 and 334 are microstrip couplers. Alternatively, couplers 332 and 334 are implemented using other coupler structures such as a hybrid coupler. In some embodiments, couplers 332 and 334 can be omitted and the output of mixer 326 can be routed to the inputs of downconversion blocks 340 and 350 via a switch, an active network, and/or a passive network. In a further embodiment, power splitter 328 can also be eliminated using a preceding active functional block with multiple outputs.

In some embodiments, additional attenuation can be provided in the path of mixer 326. In a further alternative embodiment, buffer 312 can be replaced with a VGA. In a further alternative embodiment, power sensor 324 and/or additional power sensors can be placed in other portions of the test circuit, for example, at the inputs of downconverter circuits 340 and 350 depending on the particular application and its specifications. In alternative embodiments that provide a test signal for a single RF input, power splitter 328 and/or 360 are omitted and a single coupler 332 is used.

In an embodiment, the whole functionality of the BITE 302 can be controlled via serial to parallel interface (SPI) 330. Alternatively, other interfaces can be used to control BITE 302 including other serial and parallel interface types.

In an embodiment, a number of different kinds of measurements can be performed on downconverters 340 and 350 using BITE circuit 302. For example, an embodiment LO power sweep is performed by performing a plurality of measurements in between which the gain of VGA 308 is adjusted. Conversion gain, noise figure, and the like can be measured with respect to LO power. Power sensor 316 is used to provide data on the strength of the LO drive.

In an embodiment, an RF signal power sweep is performed by varying the amplitude of the input to mixer 326 at signal LF_IN. Furthermore, input compression and linearity characteristics of downconverters 340 and 350 can be measured. For example, a 1 dB compression point can be found by sweeping the input power of mixer 326 and monitoring the outputs of downconverters 340 and 350, either digitally on or in the analog domain, for the 1 dB compression point. For example, in an embodiment, input compression is quantified by correlating the IF output amplitudes with the output of the power sensor as a measure for the RF input power. Third order intermodulation distortion is measured with respect to input power can be measured by introducing two tones at the input of mixer 326. Intermodulation distortion products are then measured at the outputs of downconverters 340 and 350.

In an embodiment, conversion gain is measured, for example, by introducing a tone at LF_IN and measuring the amplitude of the corresponding tone at the output of downconverters 340 and 350. An RF and baseband frequency sweep is performed by sweeping the frequency of the input at LF_IN. Likewise an LO frequency sweep is performed by sweeping the frequency of VCO 306 via DAC 310 and measuring the divided LO frequency at signal DIV_OUT.

In an embodiment, noise figure is measured by measuring the conversion gain of downconverter and measuring the output noise density of downconverters 340 and 350. The conversion gain measurement is performed by introducing a tone at LF_IN and measuring the amplitude of the corresponding tone at the output of downconverters 340 and 350, either digitally on in the analog domain. The output noise density of downconverters are measured by performing a time to frequency transform, such as a FFT of a digitized output of downconverters 340 and 350 if an A/D converter is implemented on-chip, or someone else in the system. Alternatively, a spectrum analyzer can be used to measure the noise output density of downconverters 340 and 350. The noise figure is then calculated according to methods known in the art. It should be appreciated that the measurement methods described herein are a few examples of a number of measurements that can be made using embodiment systems and methods.

Figure 4:
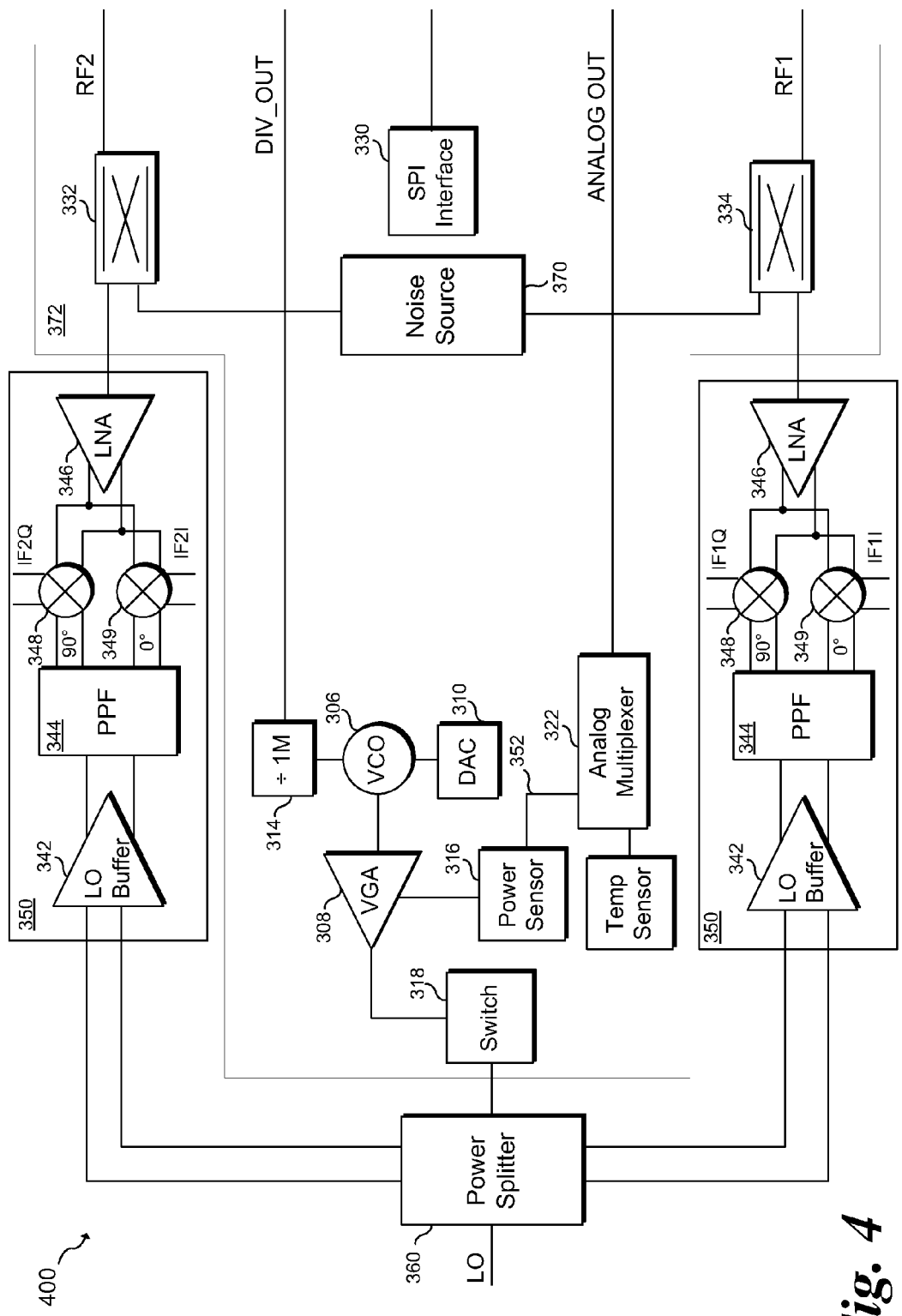
FIG. 4 illustrates an RF integrated circuit according to an alternative embodiment of the present invention.

FIG. 4 illustrates alternative embodiment system 400 having BITE 372 and an RF circuit having downcoverters 340 and 350 and power splitter 360. In an embodiment BITE 372 is similar to BITE 302 in FIG. 3, except that noise source 370 is used to provide a test input to downconverters 340 and 350 instead of mixer 326. Noise source 370 provides a known noise level to the inputs of downconverters 340 and 350. Measurements such as noise figure (NF) and conversion gain can be made by determining the output noise levels of mixers 348 and 349 in downconverters 340 and 350. In one embodiment, noise figure is measured by using a y-factor method on which noise source 370 is turned on and off. In some embodiments, the output noise levels of mixers 348 and 349 are measured digitally via using an A/D converter followed by DSP (not shown), or in an analog fashion.

In an embodiment, noise source 370 comprises an excess noise ratio (ENR) source that provides two output noise densities. In one embodiment, this noise source is implemented using an avalanche breakdown diode or noise diode. In further embodiments, other noise sources can be used, for example a resistor, or a circuit that provides amplified thermal noise. In one embodiment, the noise performance of downconverters 340 and 350 are tested by performing two output noise measurements are made, one with the a first noise density output of noise source 370, and another with a second noise density output of noise source 370. The noise figures of downconverters 340 and 350 are then calculated using y-factor noise measurement techniques, as known in the art.

Figure 5:
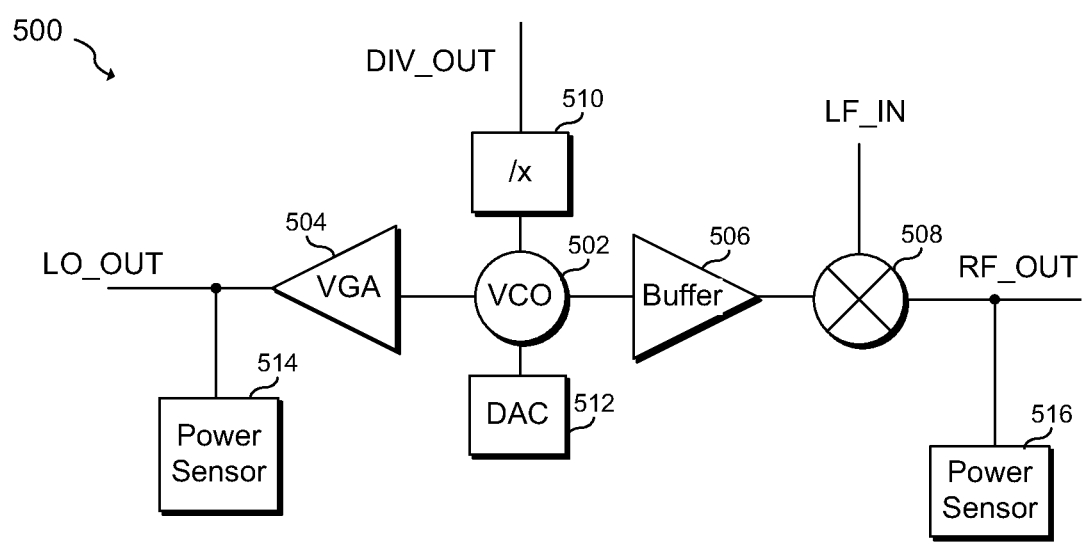
FIG. 5 illustrates a block diagram of an embodiment built-in test equipment circuit.

FIG. 5 illustrates embodiment BITE core circuit 500. Circuit 500 has VCO 502, whose frequency is controlled by DAC 512. One output of VCO 502 is routed to signal LO_OUT via VGA 504, and another output of VCO 502 is routed to mixer 508 via buffer 506. Power sensors 514 and 516 monitor the outputs of VGA 504 and mixer 508 respectively. A further output of VCO 502 is routed to divider 510, which divides the output of VCO 502 by a factor of x. In an embodiment, BITE 500 is located on an integrated circuit along with an RF circuit, such as a mm-wave circuit to be tested. During testing, LO_OUT is coupled to an LO input of the RF circuit, RF_OUT is coupled to an input of the RF circuit, an input LF_IN of LF_IN is externally coupled to a low frequency signal source. DIV_OUT is coupled, for example, to an external frequency counter.

In one example, VCO is first programmed to output a frequency of 24 GHz. Programming includes choosing an initial DAC value with which to set VCO 502. Next, the frequency of VCO is measured by measuring DIV_OUT the external frequency counter. If the division factor x=1,000,000, DIV_OUT will attain a frequency of 24 KHz when VCO 502 is operating at 24 GHz. In one embodiment, the DAC value is interactively adjusted until DIV_OUT is within a target value range.

To perform measurements that require LO adjustment, the gain of VGA 504 is varied and its corresponding power level is measured via power sensor 514. To perform measurements that require an active signal at RF_OUT, a low frequency input is introduced at LF_IN and upconverted. For example, if the LO is set to a frequency of about 24 GHz, and a 1 MHz tone is introduced at LF_IN, corresponding tones will be appear at about 24.001 GHz and about 23.999 GHz if mixer 508 is a DSB mixer. If mixer 508 is a SSB mixer, the output tone will be at about 24.001 GHz or about 23.999 GHz. The amplitude of RF_OUT can then be measured using power sensor 516. It should be appreciated that these values are examples, and other frequencies and values can be used.

In an embodiment, signals LO_OUT and RF_OUT are both derived from VCO 502. Because the LO and RF signals are correlated, and small frequency fluctuations do not adversely affect testing of a millimeter wave receiver. In some embodiments, the frequency of the LF_IN signal, which is upconverted to the RF domain by mixer 508, has the same frequency value as the frequency of the downconversion mixer output that is tested.

Advantages of embodiments of the present invention include the ability to test high frequency RF circuits, including millimeter wave circuits, without externally applying or receiving high frequency RF signals. Input and output signals to the circuit can be DC or low frequency signals. As such, a fully functional RF test can be performed on an RF circuit or an RF integrated circuit during production using a low frequency test fixture. A further advantage includes the ability to perform a fully functional test of on-chip RF circuitry within a final system application. The ability to perform such a test is advantageous with respect to system debug and/or verification. In safety related systems, the ability to perform an in system test allows for a greater decree of safety related system verification.

A further advantage of embodiments include the ability to tune the VCO using an on-chip DAC, in that the chip DAC can robustly prevent noise and spur-injection into the test signal path.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of testing a radio frequency integrated circuit (RFIC) circuit comprising an RF circuit configured to operate at high frequencies, and an on-chip test circuit comprising frequency generation circuitry configured to operate during test modes, the method comprising:
generating high frequency test signals using the on-chip test circuit;
measuring signal levels using on-chip power detectors; and
controlling and monitoring the on-chip test circuit using low frequency signals.

2. The method of claim 1, wherein the high frequencies comprise high frequencies greater than 10 GHz, and the low frequency signals comprise frequencies less than 1 MHz.

3. The method of claim 1, wherein:
controlling and monitoring the on-chip test circuit using the low frequency signals comprises applying a low-frequency test signal to an input of a mixer of the on-chip test circuit; and
generating high frequency test signals using the on-chip test circuit comprises coupling a local oscillator of the on-chip test circuit to a further input of the mixer of the on-chip test circuit.

4. The method of claim 3, wherein generating high frequency test signals using the on-chip test circuit further comprises coupling an output of the mixer of the on-chip test circuit to an RF input of the RF circuit.

5. The method of claim 3, wherein generating high frequency test signals using the on-chip test circuit further comprises coupling an output of the mixer of the on-chip test circuit to a local oscillator input of the RF circuit.

6. The method of claim 3, further comprising setting a signal power of the local oscillator of the on-chip test circuit comprising
measuring an output level of a test variable gain amplifier coupled between the local oscillator and the further input of the mixer via a first power detector comprising an output coupled to a low frequency external interface of the on-chip test circuit; and
adjusting a gain of test variable gain amplifier based on the measurement to provide a target local oscillator signal level.

7. A method of testing a radio frequency integrated circuit (RFIC) circuit comprising an RF circuit configured to operate at high frequencies, and an on-chip test circuit comprising frequency generation circuitry configured to operate only during test modes, the method comprising:
generating all high frequency test signals using the on-chip test circuit;
measuring signal levels using on-chip power detectors; and
controlling and monitoring the on-chip test circuit using low frequency signals.

8. The method of claim 7, wherein the high frequencies comprise high frequencies greater than 10 GHz, and the low frequency signals comprise frequencies less than 1 MHz.

9. The method of claim 7, further comprising testing a high frequency signal path of the RF circuit using only low-frequency test equipment.

10. The method of claim 9, wherein analog interfaces of the low-frequency test equipment communicate with the RFIC using only frequencies less than 1 MHz.

11. The method of claim 7, wherein:
controlling and monitoring the on-chip test circuit using the low frequency signals comprises applying a low-frequency test signal to an input of a mixer of the on-chip test circuit; and
generating high frequency test signals using the on-chip test circuit comprises coupling a local oscillator of the on-chip test circuit to a further input of the mixer of the on-chip test circuit.

12. The method of claim 11, wherein generating high frequency test signals using the on-chip test circuit further comprises coupling an output of the mixer of the on-chip test circuit to an RF input of the RF circuit.

13. The method of claim 11, wherein generating high frequency test signals using the on-chip test circuit further comprises coupling an output of the mixer of the on-chip test circuit to a local oscillator input of the RF circuit.

14. A method of testing a radio frequency integrated circuit (RFIC) comprising a RF receiver and a built-in test circuit, the method comprising operating the RFIC in a test mode, operating the RFIC in the test mode comprising:
coupling an LO input of the RF receiver to an output of a test oscillator of the built-in test circuit;
coupling an RF input of the RF receiver to an output of a mixer of the built-in test circuit, wherein the mixer of the built-in test circuit comprises a first input coupled to the output of the test oscillator; and
applying a test frequency from a low-frequency external interface of the built-in test circuit to a second input of the mixer of the built-in test circuit.

15. The method of claim 14, further comprising changing a mode of operation of the RFIC from the test mode to a normal mode, changing the mode of operation comprising:
shutting down the test oscillator; and
decoupling the output of the test oscillator of the built-in test circuit from the LO input of the RF receiver.

16. The method of claim 14, further comprising setting an LO signal power, setting the LO power comprising;
measuring an output level of a test VGA coupled between the test oscillator and the LO input via a first power detector comprising an output coupled to the low frequency external interface of the built-in test circuit; and
adjusting a gain of test VGA based on the measurement to provide a target LO signal level.

17. The method of claim 14, further comprising determining a conversion gain, determining a conversion gain comprising:
measuring a first signal level at the output of the mixer, via second power detector comprising an output coupled to a low-frequency interface of the built-in test circuit;
measuring a second signal level at an output of the receiver; and determining conversion gain based on measuring the first signal level and measuring the second signal level.

18. The method of claim 14, further comprising setting a frequency of the test oscillator, setting the frequency comprising:
- dividing an output frequency of the oscillator;
- providing the divided oscillator frequency to the low-frequency external interface; and
- measuring the divided oscillator frequency; and
- adjusting a frequency setting to the test oscillator based on the measuring.

19. The method of claim 18, wherein adjusting the frequency comprises writing a value to a digital-to-analog (DAC) converter comprising an output coupled to a frequency control input of the test oscillator.

* * * * *